(12) United States Patent
Bendel et al.

(10) Patent No.: US 9,209,783 B2
(45) Date of Patent: Dec. 8, 2015

(54) EFFICIENT DRIFT AVOIDANCE MECHANISM FOR SYNCHRONOUS AND ASYNCHRONOUS DIGITAL SAMPLE RATE CONVERTERS

(71) Applicant: DSP Group LTD.

(72) Inventors: Yosef Bendel, Holon, IL (US); Eyal Rosin, Rosh Ha'ayin (IL); Assaf Ganor, Herzeliya (IL)

(73) Assignee: DSP GROUP LTD., Herzeliya (IL)

( * ) Notice: Subject to any disclaimer, the term of this patent is extended or adjusted under 35 U.S.C. 154(b) by 0 days.

(21) Appl. No.: 14/613,388

(22) Filed: Feb. 4, 2015

(65) Prior Publication Data

US 2015/0244349 A1 Aug. 27, 2015

Related U.S. Application Data

(60) Provisional application No. 61/935,947, filed on Feb. 5, 2014, provisional application No. 61/982,359, filed on Apr. 22, 2014.

(51) Int. Cl.
| | |
|---|---|
| H03M 7/00 | (2006.01) |
| H03H 17/06 | (2006.01) |
| H04L 27/26 | (2006.01) |
| G10L 19/00 | (2013.01) |
| G10L 21/04 | (2013.01) |
| H04L 7/033 | (2006.01) |
| G10L 19/008 | (2013.01) |
| H04L 7/00 | (2006.01) |

(52) U.S. Cl.
CPC .......... *H03H 17/0657* (2013.01); *G10L 19/00* (2013.01); *G10L 19/008* (2013.01); *G10L 21/04* (2013.01); *H03H 17/0664* (2013.01); *H03H 17/0685* (2013.01); *H04L 7/0037* (2013.01); *H04L 7/033* (2013.01); *H04L 27/2657* (2013.01)

(58) Field of Classification Search
CPC .......... H03H 17/0685; H03H 17/0664; G10L 19/008; G10L 19/00; G10L 21/04; H04L 27/2657; H04L 7/0337; H04L 7/033
USPC ............. 341/61; 708/313; 704/501, 502, 503; 375/344, 355, 376
See application file for complete search history.

(56) References Cited

U.S. PATENT DOCUMENTS 7,061,409 B1 * 6/2006 Jantti et al. .................. 341/61

* cited by examiner

*Primary Examiner* — Joseph Lauture
(74) *Attorney, Agent, or Firm* — Reches Patents

(57) ABSTRACT

A device, comprising a first interpolator that is configured to (a) receive, at a first clock rate, a first signal having a first sampling rate and (b) output, at a second clock rate, a second signal having a first desired sampling rate average; wherein the first interpolator comprises: a first buffer for storing the first signal; and a first fractional sampling ratio circuit that is configured to generate a first pattern of fixed point values, wherein an average value of the first pattern corresponds to a first desired sampling rate ratio between the first desired sampling rate average and the first sampling rate.

19 Claims, 14 Drawing Sheets

EFFICIENT DRIFT AVOIDANCE MECHANISM FOR SYNCHRONOUS AND ASYNCHRONOUS DIGITAL SAMPLE RATE CONVERTERS

RELATED APPLICATIONS

This application claims priority from U.S. provisional patent Ser. No. 61/935,947 filing date Feb. 5, 2014 and from U.S. provisional patent Ser. No. 61/982,359 filing date Apr. 22, 2014 and both being incorporated herein by reference.

FIELD OF THE INVENTION

This invention relates to the field of digital sample rate converters.

BACKGROUND TO THE INVENTION

Sampling-rate conversion is the process of converting a discrete-time signal x[n] sampled at a rate $FS_{in}$ to another signal y[m] sampled at a rate $FS_{out}$. If the ratio $FS_{out}/FS_{in}$ is a constant then "synchronous" sampling-rate conversion may be used. A common example of sampling-rate conversion is when a portable audio player is required to accept content at a variety of input sampling-rates, $FS_{in} = \{32\ kHz, 44.1\ kHz, 48\ kHz\}$ and then must convert the stream to a fixed output rate of $FS_{out} = 48\ kHz$. Mechanisms for the conversion of the sample rate of a digital signal to a different sample rate can be found in many modern digital signal processing implementations such as audio processors and digital modems. The mechanism can be implemented using a dedicated digital hardware module or as a software implementation, for example, using a digital signal processor.

A Synchronous Sample Rate Converter (SSRC) is used when the ratio, R, between the input sample rate $FS_{in}$ and the output sample rate $FS_{out}$ is fixed and known in advance. The SSRC is given this ratio, R, as a configuration parameter. Using this parameter, R, the SSRC processes the input signal and changes its sample rate from $FS_{in}$ to $FS_{out}$ In the FIG. 1A below, a block diagram of the interpolator for an example of a synchronous sample rate converter (SSRC 1102) is depicted.

The input signal 1015 is at the sample rate of $FS_{in}$, the input clock frequency of the input clock signal 1015 is at $FS_{in}$ and the output clock signal 1030 is at a frequency of $FS_{out}$. The Rate Ratio, R 1050 is a fixed configuration parameter that is programmed to the interpolator. Ideally $R = 2^b \times FS_{out}/FS_{in}$, where b is the number of bits used to represent the fixed point number for R. The output signal 1025 y, is at the sampling rate of $FS_{out}$. The output valid signal indicates a valid output signal, y. For example, a low to high transition of the valid output signal would indicate a valid output signal, y, and the rate of low to high transitions of this signal, would therefore be equal to $FS_{out}$. The valid output signal may be a delayed version of the output clock.

A brief explanation of the operation, referring to FIG. 1A follows. Input samples of the input signal, x, are written to the input buffer 1101 of SSRC 1102 at the rate of $FS_{in}$. The input clock transitions, low to high, indicate that a new input sample should be written to the buffer. On a low to high transition of the output clock the output sampling phase is updated such that phase(n)=phase(n−1)+R. The result is that phase(n)=n R. A low to high transition of the output clock indicates that a new output sample should be calculated and the control mechanism processes the current phase value, nR, and generates two control signals: input buffer "read control" signal and interpolation "filter control". The input buffer "read control" signal determines the buffer entry from where samples are fetched to be used in the filtering operation, and the interpolation "filter control" is used to control the phase of the interpolator for proper filtering operation. The interpolation filter then filters the input samples with a proper delay shift, as per the control signal. The entire sequence of updating the phase, generating the filter and buffer read controls, the read operation of the samples from the buffer and the filtering operation occurs once on each low to high transition of the output clock.

It is desirable that the sample rate ratio, $R = FS_{in}/FS_{out}$ is represented as a fixed point number however, if the number of bits used to represent the ratio are limited, this sample rate ratio R cannot be presented as a fixed point number without some loss of accuracy. For example, if $FS_{in} = 44.1$ kHz and $FS_{out} = 48$ kHz, the ratio $R = 0.91875$. Representing this ratio R accurately as a fixed point number with 32 bits or less is not possible. If using b bits, the desired fixed point value for R is $(2^b \times R)$. So, for example, if $b=26$, then $R=61656268.80$. Therefore, if the number of bits is not sufficient, then some form of quantization must be introduced. The introduction of quantization to the sample rate ratio results in a phase that drifts away from the desired sample phase. As a result, if no special mechanism is implemented, this drift eventually will result in the SSRC sample's buffer overrunning or under-running.

To explain this problem we will first analyze a scenario where the ratio R is accurate and no drift is present in the system. Assume the elastic buffer depth is C samples/entries. Although there is no drift the phase will wander around its nominal value due to jitter that is present in the system. This jitter is mostly comprised of low frequencies and hence C should be made large enough so that the likelihood of the buffer pointer wandering more than C/2 buffer entries is negligible. Hence, having a "guard band" of C/2 entries for the buffer pointer to wander to the left or to the right side ensures that a buffer overrun or under-run is highly improbable. The actual value of C is determined by the statistical properties of the jitter of the particular use case and is beyond the scope of this discussion. The above mechanism has no direct effect on SNR.

A second analysis is provided for a scenario where the value of R is not accurate, and the buffer pointer drifts.

Let the ideal ratio, $$Ri = 2^b \times FS_{in}/FS_{out} \qquad (1)$$

And let the actual ratio $$R = Ri(1+\alpha) \qquad (2)$$

where $\alpha$ is the frequency offset

Hence, $$\alpha = (R-Ri)/Ri \qquad (3)$$

The buffer write operation is at the input sample rate, $FS_{in}$ and the read operation from the buffer is $R/2^b \times FS_{out}$ Now, from (2), and (1)

$$R/2^b \times FS_{out} = Ri(1+\alpha)/2^b \times FS_{out} = (1+\alpha)FS_{in} \qquad (4)$$

The period between two consecutive buffer write operations, Tin, is $$Tin = 1/FS_{in}$$

So hence, the average period, Pave, between two consecutive buffer read operations is:

$$Pave = 1/[FS_{in}(1+\alpha)] = Tin(1+\alpha)^{-1}$$

As α is very small, $$Pave = Tin(1-\alpha)$$

The drift per input sample time, D, is the difference between the write period and the read period, $$D = Tin - Tin(1-\alpha) = \alpha Tin$$

Hence, the time until the buffer pointer drifts one buffer entry from its nominal position (the middle of the buffer), is $$Tin/|\alpha|$$

Using the example of $FS_{in}=44.1$ kHz and $FS_{out}=48$ kHz, the ideal ratio is 0.91875. Representing this ratio as a fixed point number with 26 bits, $$Ri = 2^{26} \times 0.91875 = 61656268.80$$

Thus, $$R = 61656269$$

and $$\alpha = (R-Ri)/Ri = 0.003 \text{ ppm}$$

Hence, the time until the buffer pointer drifts one buffer entry from its nominal position, $$Tin/|\alpha| = 1/(FS_{in}|\alpha|) = 116 \text{ minutes}$$

An Asynchronous Sample Rate Converter (ASRC) is used when the ratio, R, between the input sample rate $FS_{in}$ and the output sample rate $FS_{out}$ is not fixed and not known in advance. In this case it is likely that the sample rate ratio will vary over and be subject to change. $FS_{in}$ and $FS_{out}$ may be derived from difference clock sources and hence are asynchronous.

As shown in FIG. 1D, an ASRC is comprised of two major parts: a phase tracking unit and an interpolator.

The phase tracking unit processes the two clock signals, clock_in and clock_out, and calculates an accurate estimate of a frequency ratio Rc. The interpolator then uses this frequency ratio, Rc, to perform the actual sample rate conversion.

Referring to FIG. 1D:

clock_in is a clock signal at a frequency $f_{clock\_in}$ that relates to the input signal sample rate clock_out is a clock signal at a frequency $f_{clock\_out}$ that relates to the output signal sample rate FSin is the sample rate of the input signal FSout is the sample rate of the output signal The sample rate ratio, $R=FS_{in}/FS_{out}$ Rc is the clock frequency ratio where $Rc = f_{clock\_in}/f_{clock\_out}$ In the general case, $$f_{clock\_in} = 2^{Nin} \cdot S_{1,in}/S_{2,in} \cdot FSin$$

where Nin, $S_{1,in}$, and $S_{2,in}$ are integers.

$$f_{clock\_out} = 2^{Nout} \cdot S_{1,out}/S_{2,out} \cdot FSout$$

where Nout, $S_{1,out}$, and $S_{2,out}$ are integers.

In practice therefore, the output, Rc of the phase tracking unit is:

$$\begin{aligned}
Rc &= f_{clock\_in}/f_{clock\_out} \\
&= (2^{Nin} \cdot S_{1,in}/S_{2,in} \cdot FSin)/(2^{Nout} \cdot S_{1,out}/S_{2,out} \cdot FSout) \\
&= 2^{(Nin-Nout)} \cdot (S_{1,in} \cdot S_{2,out})/(S_{2,in} \cdot S_{1,out}) \cdot (FSin/FSout) \\
&= 2^N \cdot S_1/S_2 \cdot (FSin/FSout)
\end{aligned}$$

where N, $S_1$ and $S_2$ are integers.

Hence, $$Rc = 2^N \cdot S_1/S_2 \cdot R$$

and $$R = 2^{-N} \cdot S_2/S_1 \cdot Rc$$

Therefore, in order to scale Rc a direct solution would be to multiply the value of Rc by $2^{-N} \cdot S_2/S_1$. Whereas scaling by $2^{-N}$ is straightforward, a simple shift operation, scaling by $S_2/S_1$ involves an integer ratio. It is desirable that the scaling factor, $S_2/S_1$, is represented as a fixed point number, however, if the number of bits used to represent the scaling factor are limited, this scaling factor $S_2/S_1$ cannot be presented as a fixed point number without some loss of accuracy. As a result, the calculated R is also inaccurate.

Yet for another example—referring to FIG. 1C—an application processor transfers an audio stream at 44.1 ksps to the interface IC which contains an asynchronous sample rate converter (ASRC). This 44.1 ksps stream is transferred over the SlimBus which uses a basic clock of 24,576 kHz. The SlimBus scheme allocates certain slots of its bus bandwidth in order to transfer the 44.1 ksps stream, but the clock is at 24,576 kHz. The ASRC inside the interface IC converts the 44.1 ksps stream to a 48 ksps stream which is sent over the I2C bus to the audio codec. FIG. 1B depicts the ASRC of this scenario.

As shown in FIG. 1D, the following relationships apply:

$$R = FSin/FSout = 44100/48000 = 0.91875$$

$$f_{clock\_in} = 24{,}576 \text{ kHz and } f_{clock\_out} = 48 \text{ kHz}$$

$$f_{clock\_in} = 2^{Nin} \cdot S_{1,in}/S_{2,in} \cdot FSin = 2^{Nin} \cdot S_{1,in}/S_{2,in} \cdot 44100 = 24576000$$

Hence, $$Rc = f_{clock\_in}/f_{clock\_out} = 24576/48$$

The relationship between the available 24576 kHz clock and the desired 44.1 kHz clock is:

$$\begin{aligned}
f_{clock\_in} &= 2^{Nin} \cdot S_{1,in}/S_{2,in} \cdot 44100 = 24576000 \\
&= 2^9 \cdot 160/147 \cdot 44100 = 24576000
\end{aligned}$$

Hence, $$Rc = 2^N \cdot S_1/S_2 \cdot R$$

As a result, in this example, scaling by a factor of $2^{-9} \cdot 147/160$ is required in order to use the correct rate ratio by the interpolator.

i.e.

$$FSin = f_{clock\_in} \cdot 2^{-Nin} \cdot S_{2,in}/S_{1,in}$$

$$44100 = 24576000 \cdot 2^{-9} \cdot 147/160$$

As pointed out previously, scaling by $2^{-N}$ is simple but to make a fixed point binary representation of a value $Sf = S_{2,in}/S_{1,in}$ such as 147/160 without loss of accuracy requires an infinite number of bits. Note that for this specific example $S_{2,in}/S_{1,in} = 147/160$ equals the fractional representation of the ideal ratio for R, i.e. $147/160 = 0.91875$.

Representing this ratio accurately as a fixed point number without introducing a loss of accuracy would require an infinite number of bits and hence to make the fixed point presentation feasible, quantization must be introduced. As a result, the calculate sample rate ratio, R is also inaccurate. The introduction of inaccuracy to the sample rate ratio results in a difference between the desired phase and the actual phase and unless special mechanisms are introduced the phase drift will eventually produce an overrun or an under-run in the interpolator input buffer.

When the value of R is not accurate, there will be drift. This can be explained as follows:

Let the actual scaling factor be $$Sf = Sfi(1+\alpha) \quad (1)$$

where $\alpha$ is the frequency offset
and $Sfi = S_2/S_1$, the desired scaling factor without inaccuracy due to quantization.

Let the ideal sample rate ratio, $$Ri = 2^{-N} \cdot Sfi \cdot Rc = FS_{in}/FS_{out} \quad (2)$$

The actual ratio is $$R = 2^{-N} \cdot Sf \cdot Rc = 2^{-N} \cdot Sfi \cdot (1+\alpha) \cdot Rc = Ri(1+\alpha) \quad (3)$$

Hence, $$\alpha = (R-Ri)/Ri \quad (4)$$

The buffer write operation is at the input sample rate, $FS_{in}$ and the read operation from the buffer is at a rate $R \times FS_{out}$ Now, from (3), and (2)

$$R \times FS_{out} = Ri(1+\alpha) \times FS_{out} = (1+\alpha)FS_{in} \quad (5)$$

The period between two consecutive buffer write operations, Tin, is $$Tin = 1/FS_{in}$$

So hence, the average period, Pave, between two consecutive buffer read operations is:

$$Pave = 1/[FS_{in}(1+\alpha)] = Tin(1+\alpha)^{-1}$$

As $\alpha$ is very small, $$Pave = Tin(1-\alpha)$$

The drift per input sample time, D, is the difference between the write period and the read period, $$D = Tin - Tin(1-\alpha) = \alpha Tin$$

Hence, the time until the buffer pointer drifts one buffer entry from its nominal position (the middle of the buffer), is $$Tin/|\alpha|$$

Using the example of $Sf = 147/160$ the ideal scaling factor is 0.91875. Representing this ratio as a fixed point number with 26 bits, $$2^b \cdot Sfi = 2^{26} \times 0.91875 = 61656268.80$$

Thus, $$2^b \cdot Sf = 61656269$$

and $$\alpha = (R-Ri)/Ri = (Sf-Sfi)/Sfi = 0.003 \text{ ppm}$$

Hence, the time until the buffer pointer drifts one buffer entry from its nominal position, $$Tin/|\alpha| = 1/(FS_{in}|\alpha|) = 116 \text{ minutes}$$

The drift rate, D, can be reduced and sometimes avoided if a sufficient number of bits are used for the fixed point representation of the sample ratio clock Rc. However, in a hardware implementation, increasing the number of bits will result in a higher area and increased power consumption and in a software implementation, increasing the number of bits above the processor word width, say 32 bit, would then require double precision arithmetic, resulting in higher MIPS requirement and increased power consumption. Another approach is to increase the buffer depth such that the time before the overrun occurs can be longer, as depicted in the FIG. 1A.

If the buffer size is C and there is no jitter and just drift is present, then the overrun or under-run will occur after a period of $(Tin \cdot C)/2|\alpha|$.

The drift rate, D, can be reduced or avoided if a sufficient number of bits are used for the fixed point representation of the sample ratio R. However, in a hardware implementation, increasing the number of bits will result in a higher area and increased power consumption and in a software implementation, increasing the number of bits above the processor word width, say 32 bit, would then require double precision arithmetic, resulting in higher MIPS requirement and increased power consumption. Another approach is to increase the buffer depth of the SSRC such that the time before the overrun occurs can be longer, as depicted in the FIG. 1A below. If the buffer size is C and there is no jitter and just drift is present, then the overrun or under-run will occur after a period of $(Tin \cdot C)/2|\alpha|$.

For the drift that occurs in the SSRC scenario drift avoidance can be achieved by implementing an asynchronous sample rate convertor (ASRC). In an asynchronous sample rate converter (ASRC) the input and the output clocks are derived from different sources. Effectively an ASRC 1008 adds a phase tracking unit 1102 to the SSRC 1102, as shown in FIG. 1B.

The phase tracking unit has two clock input signals, $F_{in}$ and $F_{out}$: The first clock signal, $F_{in}$ is at the input sample rate, $FS_{in}$, and the other input signal, $F_{out}$, is the output sample rate, $FS_{out}$. The phase tracking unit output is a value representing the sample rate ratio R in a fixed point format. In this case, however, the value of R is not fixed but fluctuates between several values in a manner that ensures that the average exactly matches the desired sample rate ratio. In this way the drift is completely avoided. A sufficient number of bits is selected for the fixed point representation of R to ensure that the SNR degradation due to jitter resulting from the fluctuations is negligible. In a typical implementation, the number of bits that is required to ensure negligible jitter is much smaller than the number of bits required for decreasing the time for the buffer to overrun or under-run. However, adding the tracking unit to the SSRC increases the complexity, area and power consumption of the rate convertor. In addition to that, before actual sample rate conversion can start, the tracking unit must first lock onto the frequency ratio. Note also that, in certain cases, the actual clocks representing the sample rate rates are not readily available to be processed.

A full duplex ASRC performs the conversion in both directions simultaneously. FIG. 1E below is a representation of a full duplex ASRC.

In the case of bi-directional traffic, there are two ASRCs 1008 and 1009—a first ASRC 1008 that converting signal FS A to signal FS B, and the second ASRC 1009 for converting signal FS B to signal FS A with the corresponding clock frequency ratios being Rc and 1/Rc respectively. The conventional method would be to simply use two phase tracking blocks as shown in FIG. 1E. A scheme is proposed that uses just one phase tracking block with two interpolators.

SUMMARY OF THE INVENTION

According to an embodiment of the invention there is provided a variation on the synchronous sample rate converter such that the phase tracking of an asynchronous sample rate converter is effectively replaced by a "fractional R" scheme which is used to generate an accurate value for R. The value for R is then derived from a single source and is accurate without the need for a high number of bits to represent the fixed point value of R.

A fractional scheme is used to produce a value for the ratio R that is accurate. A fixed pattern is used to vary between two fixed point values. The first value is the fixed point value integer of the ratio, I, and the second value is I+1. By switching the value between I and I+1, with a ratio of n1 to n2, the average value can be made to exactly equal the desired value for R.

For example, if $FS_{in}$, and $FS_{out}$ are 44.1 ksps and 48 ksps respectively, then the desired ratio, R, is 0.91875. If using b bits, the desired fixed point value for R is $(2^b \times R)$.

Hence if b=26, then R=61656268.80. Therefore the value for I=INTEGER$(2^b \times R)$=61656268 and I+1 is 61656269. To produce the ratio of I and I+1 required to provide the fractional part of R, 0.80, a ratio of 1 to 4 is required, i.e. n1=1 and n2=4, and hence (I+1) is send 4 times and I is sent once, repeatedly.

$$\text{Average } R = (n1 \times I + n2 \times (I+1))/(n1+n2) = (I+4 \times (I+1))/5 = (5 \times I + 4)/5 = I + 4/5 = I + 0.8$$

$FS_{in}$, $FS_{out}$ R, I, b, n1 and n2 are related as follows:

$FS_{in}$=Input sample rate $FS_{out}$=Output sample rate $FS_{in}/FS_{out}$=M/L where M and L are positive integers b=Number of bits.

R in fixed point=$(2^b \times M/L)$

I=INTEGER$(2^b \times M/L)$

Let

G=GCD$[(2^b \times M - L \times I), L]$ where GCD is the greatest common denominator
Then n2=$(2^b \times M - L \times I)/G$ n1=L/G−n2

Hence, using the same example as previous, $FS_{in}$=44.1 ksps $FS_{out}$=48 ksps $FS_{in}/FS_{out}$=M/L=147/160 M=147 and L=160 b=26

Hence,

R in fixed point=$(2^{26} \times 147/160)$=61656268.80

I=INTEGER$(2^{26} \times 147/160)$=61656268

G=GCD$[(2^{26} \times 147 - 160 \times 61656268), 160]$=32

Then n2=$(2^{26} \times 147 - 160 \times 61656268)/32$=4 and n1=160/32−4=1

Therefore the desired sample rate ratio sequence is a repetitive series where each series period has the following pattern: 61656268, 61656269, 61656269, 61656269, 61656269; the average value of which is 61656269.80.

For given values of $FS_{in}$ and $FS_{out}$ the values for n1 and n2 can be calculated and the sample rate pattern for I and I+1 derived. This pattern has the result that drift in the phase is completely eliminated and there is zero chance for an overrun or under-run. This scheme is termed "fractional R".

The following simulation compares the fixed sample rate ratio obtained with R=INTEGER$(2^b \times M/L + 0.5)$ to the method described in this invention.

The signal used for interpolation is a sinusoid at f0=20 kHz
Number of bits used for the fixed point value of R, b=26 bits.

The results are given in the Table below:

| FSin [Ksps] | FSout [Ksps] | Fo [kHz] | n1 | n2 | R | Sample rate offset [ppm] | Time to drop/skip [Minutes] |
|---|---|---|---|---|---|---|---|
| 44.1 | 48 | 20 | n/a | n/a | 61656269 | −0.003 | 116 |
| 44.1 | 48 | 20 | 1 | 4 | 61656268/ 61656269 | 0 | Inf |
| 48 | 44.1 | 20 | n/a | n/a | 73043661 | 0.007 | 51 |
| 48 | 44.1 | 20 | 74 | 73 | 73043661/ 73043662 | 0 | Inf |

As can be seen in the table, for the two cases where the fractional R is used the drift is fully eliminated. If a fixed R is used a drift is present and a sample drop or skip occurs due to the buffer overrun or under-run. The time for the buffer to overrun or under-run depends on the buffer size. It should be noted that the buffer acts as an elastic buffer and compensates for the jitter that is present in the system due to the fractional R values and is therefore retained in the fractional R scheme. There is no SNR degradation using the fractional R scheme compared to the fixed sample rate ratio. The actual size of the buffer is determined by the summation of the size required due to jitter considerations.

According to an embodiment of the invention, in the case of a unidirectional ASRC, in order to produce a value for R that is accurate a fractional scheme is used.

As previously explained the ideal scaling factor, $Sf_i = S_2/S_1$ where Sf is a time varying estimate of $Sf_i$. A fixed pattern is used to vary between two fixed point values. The first value is the fixed point value integer of the ratio, I, and the second value is I+1. By switching the value between I and I+1, with a ratio of n1 to n2, the average value can be made to exactly equal the desired value for $Sf_i$.

$Sf_i$, $S_1$, $S_2$, b, n1 and n2 are related as follows:

$Sf_i = S_2/S_1$

I=INTEGER$(2^b \cdot S_2/S_1)$ where b=number of fractional bits in scaling factor representation
Let G=GCD$[(2^b \cdot S_2 - S_1 \cdot I), S_1]$ where GCD is the greatest common denominator
Then n2=$[(2^b \cdot S_2 - S_1 \cdot I)]/G$ n1=$S_1/G - n2$ For example, using the example given in figure C the desired scaling factor, $Sf_i$, is R, where R, the sample clock rate is equal to 0.91875. If using b bits and b=26, then $2^b \cdot Sf$=61656268.80. Therefore the value for I=INTEGER$(2^b \times R)$=61656268 and I+1 is 61656269. To produce the ratio of I and I+1 required to provide the fractional part 0.80, a ratio of 1 to 4 is required, i.e. n1=1 and n2=4, and hence (I+1) is send 4 times and I is sent once, repeatedly.

$$\text{Average } Sf=(n1\times I+n2\times(I+1))/(n1+n2)=(I+4\times(I+1))/5= (5\times I+4)/5=I+4/5=I+0.8$$

Note that the value 0.8=4/5 cannot be represented in binary format using a finite number of bits, the binary representation is 0.11001100110011 . . . recurring.

Hence, using the same example as previous, $$S_2/S_1=147/160$$

$$b=26$$

Hence, $$2^b \cdot Sf=(2^\wedge 26\times 147/160)=61656268.80$$

$$I=\text{INTEGER}(2^\wedge 26\times 147/160)=61656268$$

$$G=GCD[(2^\wedge 26\times 147-160\times 61656268),160]=32$$

Then $$n2=(2^\wedge 26\times 147-160\times 61656268)/32=4$$

and $$n1=160/32-4=1$$

Therefore the desired sample rate ratio sequence is a repetitive series where each series period has the following pattern: 61656268, 61656269, 61656269, 61656269, 61656269; the average value of which is 61656269.80.

For given values of $S_1$ and $S_2$ the values for n1 and n2 can be calculated and the sample rate pattern for I and I+1 derived. This pattern has the result that drift in the phase is completely eliminated and there is zero chance for an overrun or underrun of the interpolator buffer. This scheme is termed "fractional scaling factor".

In place of using two independent ASCRs to implement a duplex ASRC, as shown in FIG. 1E, a scheme is introduced that includes a single phase tracking block with two interpolators as shown in FIG. 4A below.

The ASCR that converts signal FS A to signal FS B operates as the simplex scheme. If required, proper scaling of the clock frequency ratio can be carried out inside the phase tracking unit or the interpolator unit by either using the fractional scaling factor scheme as per this invention, or by other methods. The desired value for the clock frequency ratio for ASRC that converts signal FS B to signal FS A is 1/Rc. To avoid inaccuracies in the 1/Rc estimation for this second ASRC a closed loop converter block is implemented that converts the ratio from Rc to 1/Rc. This closed loop converter could be included in all interpolator blocks. Consider a product that includes a bank of phase tracking blocks and interpolator units. A flexible interconnect mechanism would enable a user to configure multiple ASRC units at simplex or full duplex using this bank. The user can allocate phase tracking units form the bank to form specific ASRCs and when a full duplex ASRC is required, only a single phase tracking block is required.

A block schematic diagram for an example closed loop converter is shown in FIG. 4B below.

The schematic diagram shown in FIG. 4B refers to a digital implementation of fixed point numbers with two's complement to represent positive and negative error, e(m). The input R(m) and the output G(m) are a series of discrete positive fixed point numbers. The processing is carried out by two fixed point adders, one fixed point multiplier and a shifter. A simple explanation of the action of the closed loop follows.

Note that the analysis refers to a discrete scenario of iterative processes based on a discrete index m.

At step m, the input is R(m) which is equal to R.

Assume that $$G(m-1)=1/R+\delta(m-1)$$

where $\delta(m-1)$ is a small error.

The output of the multiplier is then $$R(m) \cdot G(m-1)=R \cdot (1/R+\delta(m-1))=1+R\cdot\delta(m-1)$$

This value is then subtracted from one in the first adder to produce the error value e(m).

Hence, $$e(m)=1-R(m)\cdot G(m-1)=1-(1+R\cdot\delta(m-1))=-R\cdot\delta(m-1)$$

The action of the shifter is to multiply the error e(m) by a value of k, where $k=2^{-N}$ where N is the number of shifts performed on the error after the shifter, which shifts the e(m) bits to effectively reduce the value of e(m), the resulting value, $k\cdot e(m)$ is applied to one input of the second adder. The other input to this adder is G(m−1). Hence, the output of the second adder, $$G(m)=k\cdot e(m)+G(m-1).$$

Therefore, $$G(m)=-k\cdot R\cdot\delta(m-1)+1/R+\delta(m-1)=1/R+\delta(m-1)(1-k\cdot R)=1/R+\delta(m)$$

To ensure the error of G(m) is less than that of $$G(m-1): |\delta(m)|<|\delta(m-1)|$$

$$|\delta(m-1)|\cdot|(1-k\cdot R)|<|\delta(m-1)|$$

$$|(1-k\cdot R)|<1 \rightarrow (1-k\cdot R)<1 \quad \text{and} \quad (1-k\cdot R)>-1 \rightarrow k\cdot R>0 \text{ and } k\cdot R<2.$$

k·R is always positive since k and R are both positive. Therefore, by taking a sufficiently small k the error is further reduced and the output G(m) will approach and be almost exactly equal to 1/R, the desired output value.

The closed loop can be perceived as a special case of the normalized LMS (least mean square) algorithm which finds the inverse of linear system form the special case of a single tap-gain transfer function. LMS convergence properties are well known and convergence is guaranteed for a sufficiently small value for k. It is also guaranteed that the error function is convex and hence has a single minimum point.

The initialization of the value for G(m) could either be an estimate of the correct value, or a simple value such as one or zero. G(m) would use the same number of bits as R(m). The value of k would be a power of 2 so as to simplify the implementation and hence a shifter can be used. In the general case, R(m) may vary slightly as the clock frequencies may slowly drift over time. G(m) will track these slow drifts and changes.

DESCRIPTION OF DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE INVENTION

Figure 1A:
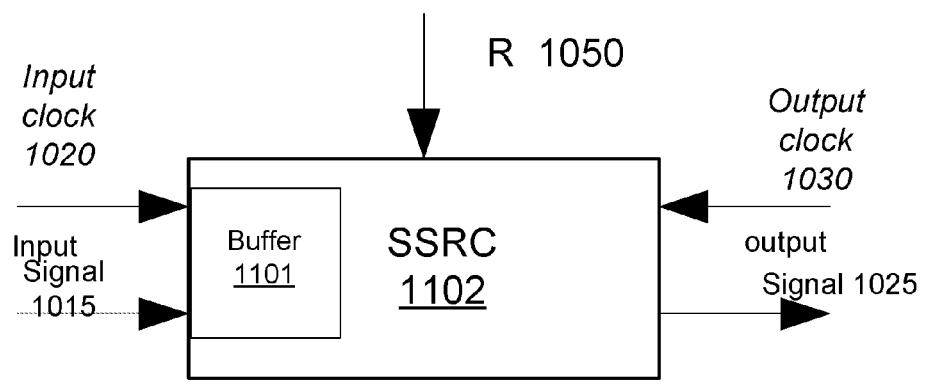
FIG. 1A illustrates a prior art synchronous sample rate converter.
Figure 1B:
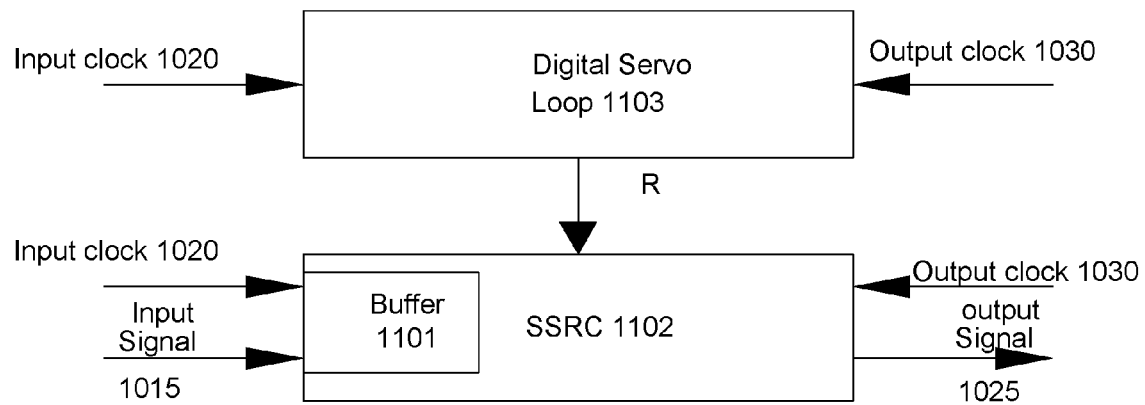
FIG. 1B illustrates a prior art asynchronous sample rate converter.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

Figure 2A:
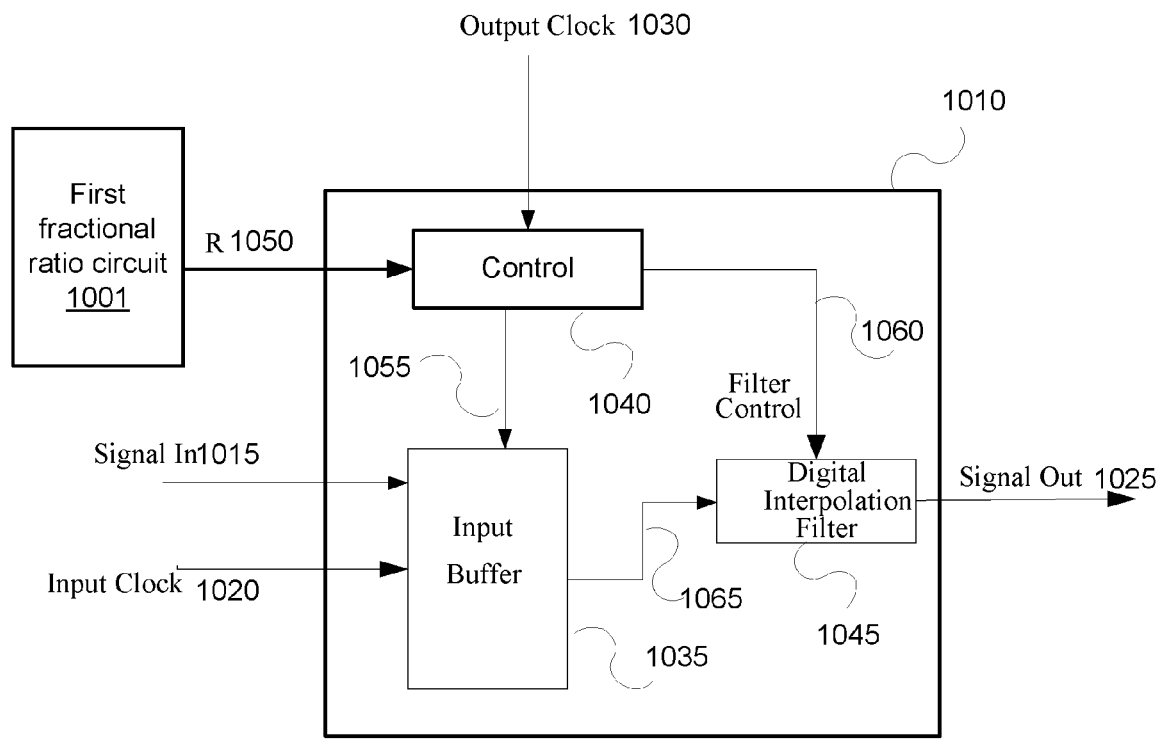
FIG. 2A illustrates a synchronous sample rate converter according to an embodiment of the invention.
Figure 3A:
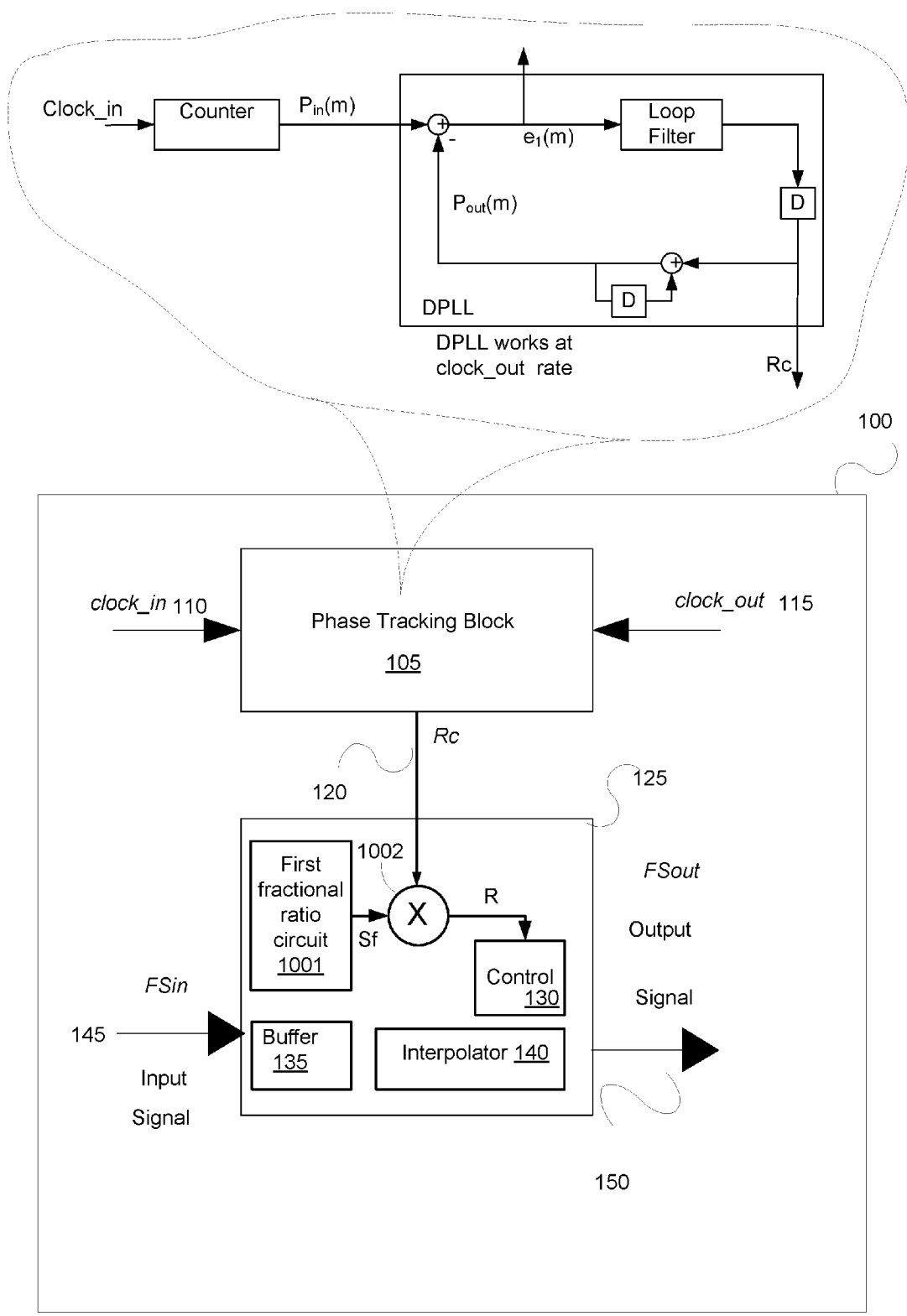
FIG. 3A illustrates an asynchronous sample rate converter according to an embodiment of the invention.
Figure 4A:
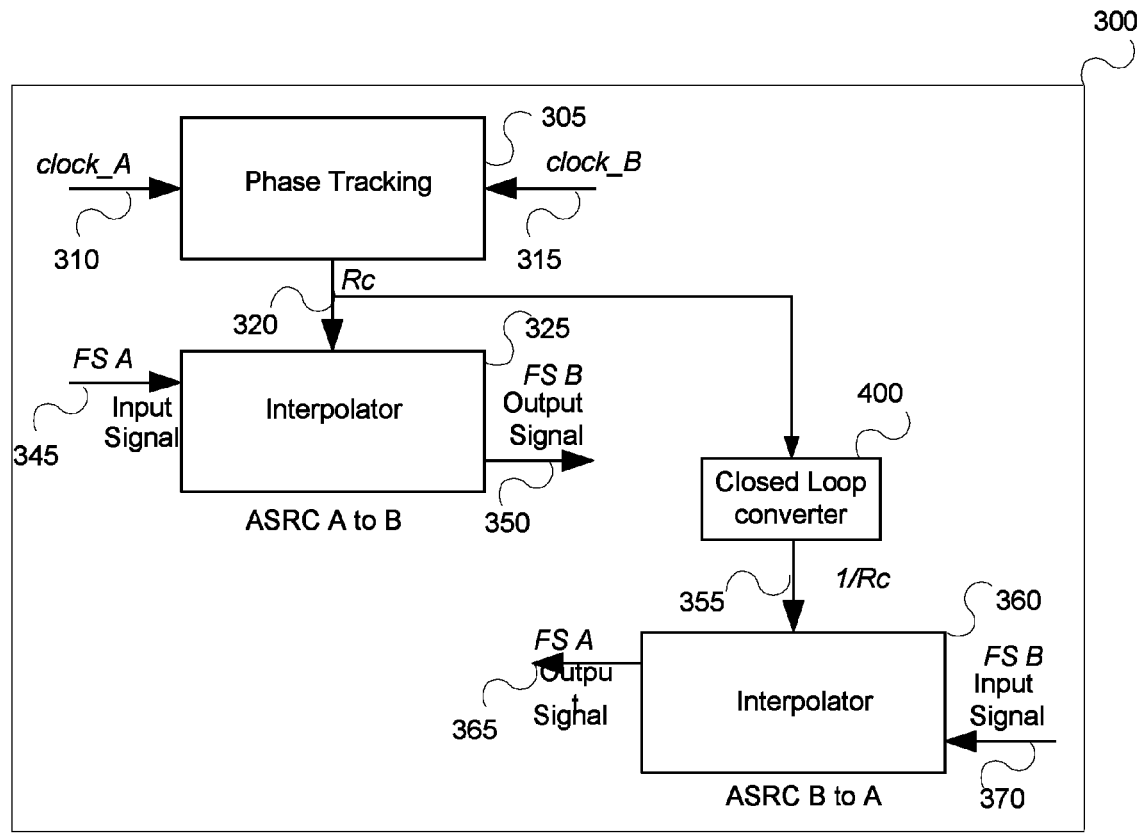
FIG. 4A illustrates a full duplex asynchronous sample rate converter according to an embodiment of the invention.

According to an embodiment of the invention there may be provided a device that may include a first interpolator. The device may be an integrated circuit, an electronic board, a computer, a mobile phone, an audio player, a media player, and the like. FIGS. 2A and 3A illustrate non limiting examples of a first interpolator. FIG. 4A illustrates first and second interpolators.

Figure 2B:
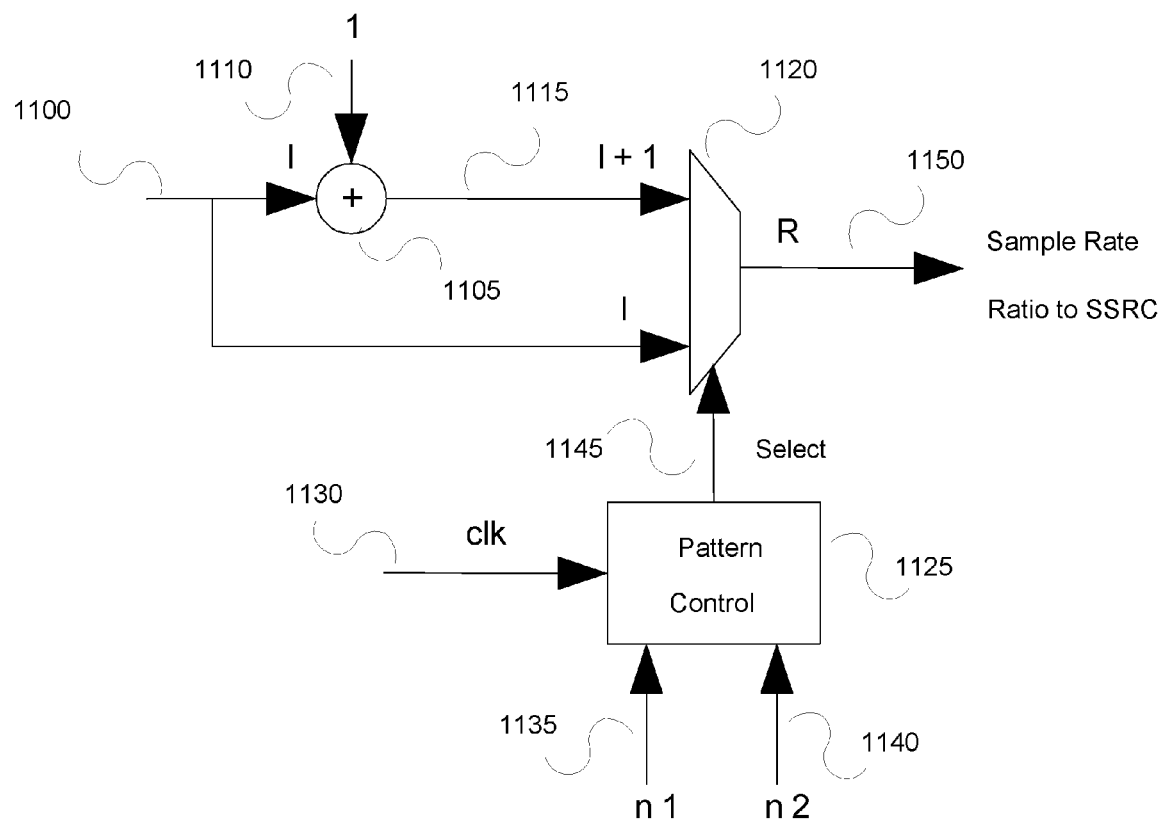
FIG. 2B illustrates a fractional sampling ratio circuit of the synchronous sample rate converter of FIG. 2A according to an embodiment of the invention.
Figure 3B:
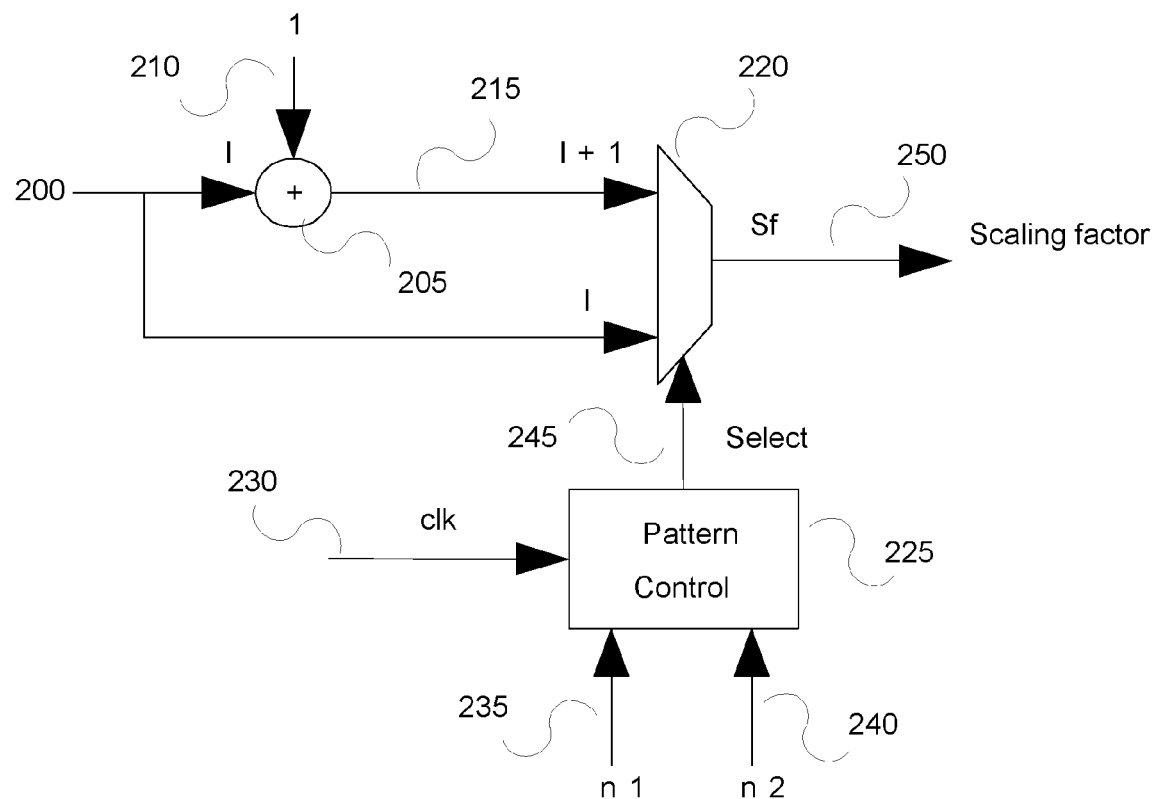
FIG. 3B illustrates a fractional sampling ratio circuit of the Asynchronous sample rate converter of FIG. 2B according to an embodiment of the invention.

The first interpolator may be configured to (a) receive, at a first clock rate, a first signal having a first sampling rate and (b) output, at a second clock rate, a second signal having a first desired sampling rate average. The first interpolator may include a first buffer for storing the first signal; and a first fractional sampling ratio circuit that is configured to generate a first pattern of fixed point values, wherein an average value of the first pattern corresponds to a first desired sampling rate ratio between the first desired sampling rate average and the first sampling rate. Non-limiting examples of a first fractional ratio circuit are shown in FIGS. 2B and 3B.

In FIGS. 2A, 2B, 3A and 3B the first signal was referred to as an input signal and the second signal was referred to as an output signal.

Figure 4B:
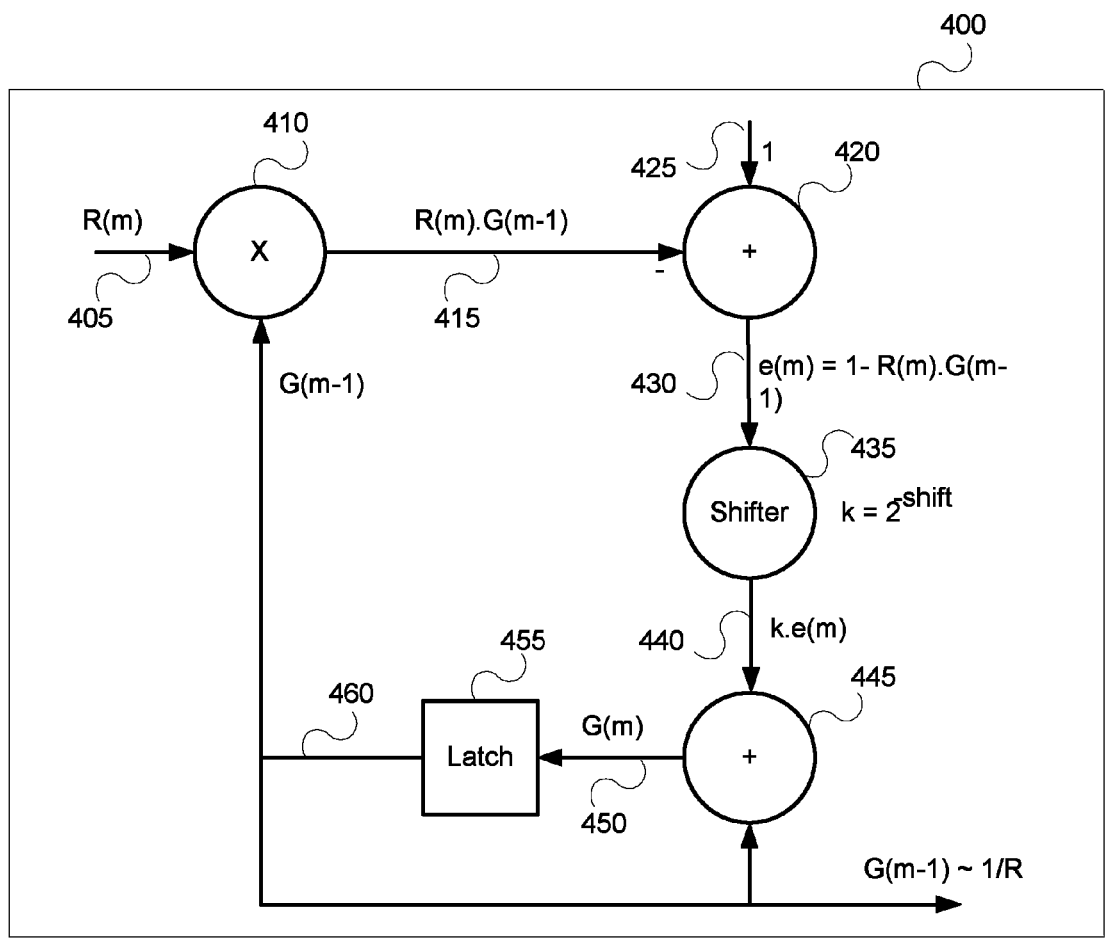
FIG. 4B illustrates a closed loop converter of the full duplex asynchronous sample rate converter of FIG. 4A according to an embodiment of the invention.

In FIGS. 4A and 4B there are input signals from both directions of the full duplex asynchronous sample rate converter and thus the input signal from a first direction (fed to ASRC A to B) is still referred to as a first signal (or input signal FS A), while the second input signal from a second direction (fed to ASRC B to A) is referred to as a third signal (of input signal FS B).

In FIGS. 4A and 4B there are output signals from both directions of the full duplex asynchronous sample rate converter and thus the output signal from a first direction (outputted from ASRC A to B) is still referred to as a second signal (or output signal FS B), while the second output signal from the second direction (outputted from ASRC B to A) is referred to as a fourth signal (of output signal FS A).

In FIGS. 2B and 3B the first pattern includes only two fixed point values (I and I+1). It is noted that the pattern may include more than two fixed patterns. While FIGS. 2B and 3B illustrate fixed values that differ from each other by one—the fixed patterns may differ from each other by more than one (for example I and I+Delta, wherein Delta exceeds one). Usually smaller offsets result in lower signal to noise ratio.

In FIGS. 2B and 3B the first fractional ratio circuit is illustrated as including a first adder for adding (a) an offset (such as one) to (b) a first fixed point value (I) that is an integer value of the first desired sampling rate ratio, to provide a second fixed point value (I+1); a first multiplexer that has (a) a first input for receiving the first fixed point value, (b) a second input for receiving the second fixed point value; (c) a control input for selecting, in response to a control signal, between the first and second fixed point values to provide the first pattern; and a pattern control circuit that is configured to provide the control signal.

In FIG. 3A the device includes a first phase tracking block that is arranged to (a) receive a first clock signal of the first clock rate, (b) receive a second clock signal of a second clock rate, (c) calculate a first clock frequency ratio (Rc) between the second clock rate and the first clock rate.

The interpolator is configured to set the first desired sampling rate ratio in response to the clock frequency ratio.

The desired sampling rate ratio may equal the clock frequency ratio (Rc).

Figure 1C:
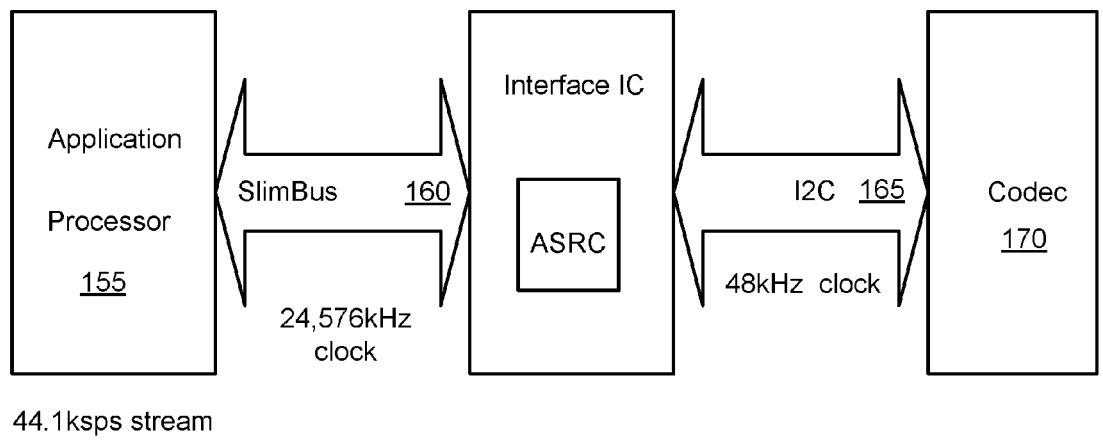
FIG. 1C illustrates a prior art asynchronous sample rate converter, an application processor and a codec.
Figure 1D:
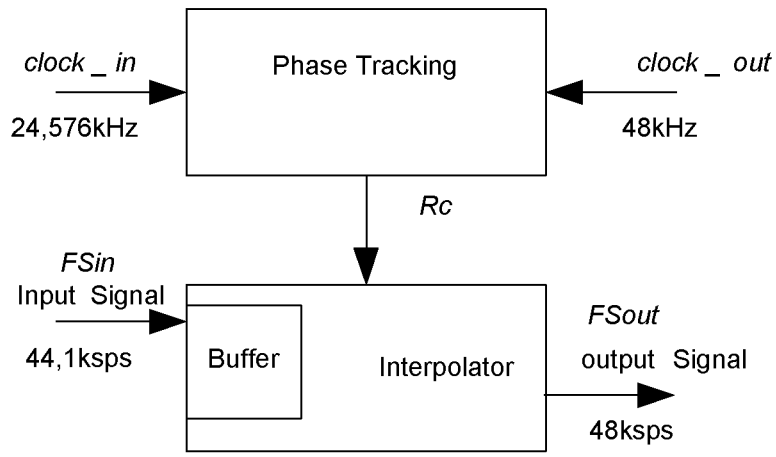
FIG. 1D illustrates values of clock signals and sampling rates that are fed to the prior art asynchronous sample rate converter of FIG. 1C.
Figure 1E:
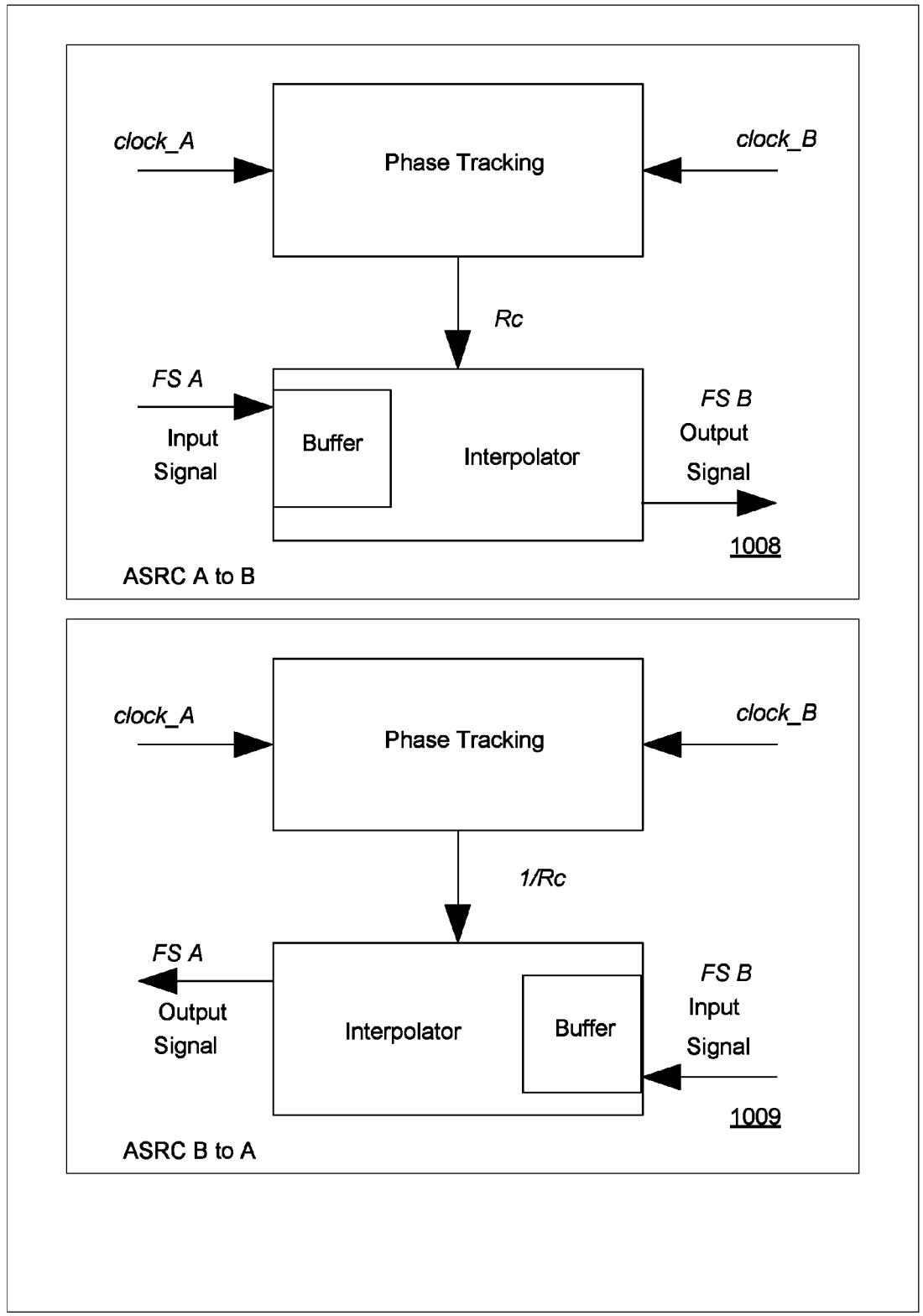
FIG. 1E illustrates a prior art full duplex asynchronous sample rate converter.
Figure 1F:
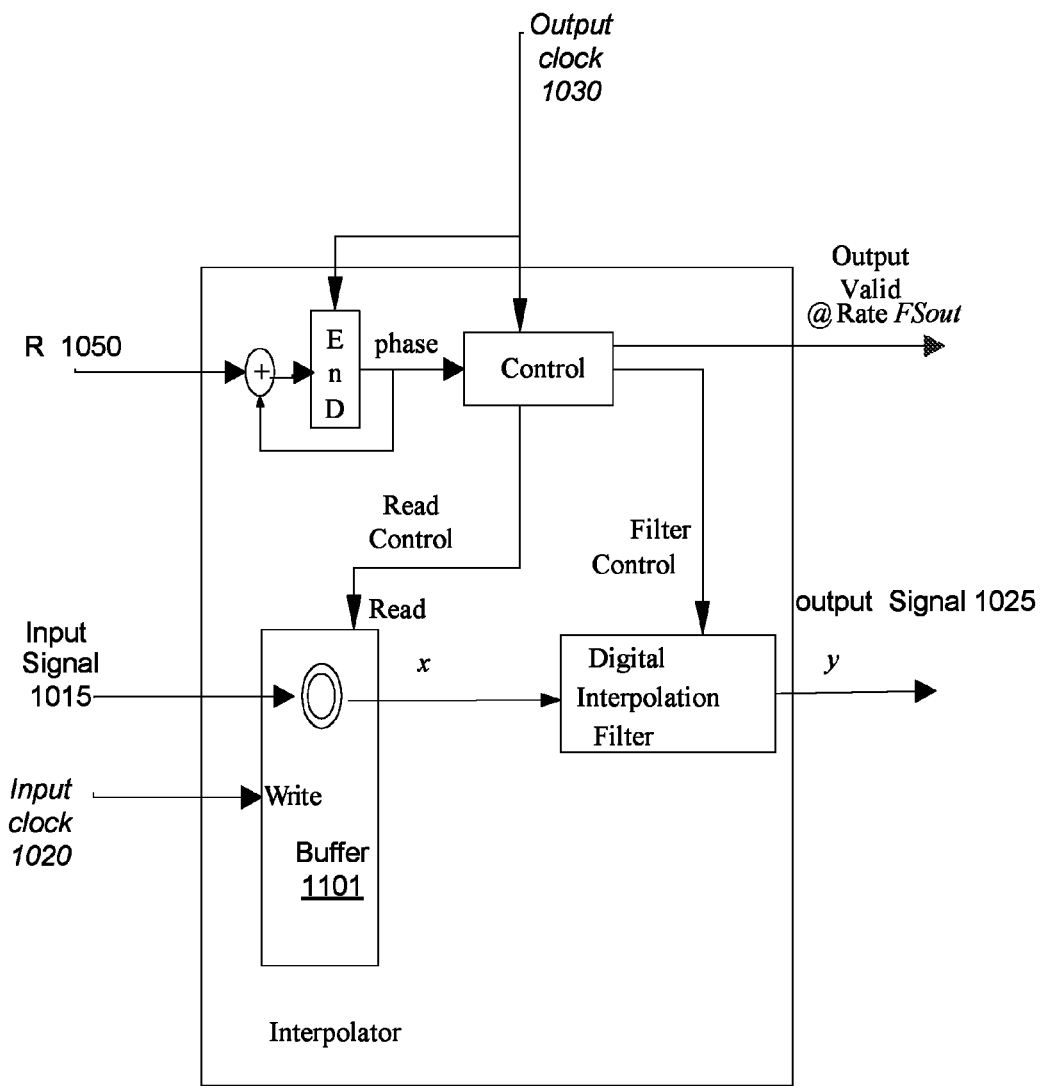
FIG. 1F illustrates a prior art synchronous sample rate converter.

It is noted that in some scenarios the desired sampling rate ratio differs from the clock frequency ratio—see for example FIGS. 1C and 1D. In these figures the first clock rate differs from the first sampling rate a factor that is responsive to a relationship between the first clock rate and the first sampling rate.

As indicated above, FIG. 4A illustrates a device that includes a second interpolator that is configured to (a) receive, at the second clock rate, a third signal having the second sampling rate and (b) output, at the first clock rate, an fourth clock signal having a second desired output sampling rate average; wherein the second interpolator comprises: a second buffer for storing the third signal; and a second fractional sampling ratio circuit that is configured to generate a second pattern of fixed point values, wherein an average value of the second pattern corresponds to a second desired sampling rate ratio between the second desired output sampling rate average and the second sampling rate.

The first interpolator of FIG. 4A may configured to set the first desired sampling rate ratio in response to the first clock frequency ratio (Rc). The second interpolator is configure to set to second desired sampling rate ratio in response to a reciprocal of the first clock frequency ratio(1/Rc)—or to an approximation of the reciprocal of the first clock frequency ratio.

In FIG. 4A the device includes a reciprocal calculator that is configured to (a) receive the first clock frequency ratio and (b) calculate the approximation of the reciprocal of the first clock frequency ratio.

In the device of FIG. 4A the first phase tracking block is an only phase tracking block that feeds the first and second interpolators.

FIG. 2A is a block schematic diagram of a typical synchronous sample rate converter 1010. The input samples of a first signal such as input signal 1015 are clocked into the first buffer 1035 by transitions of the first clock signal (input clock signal 1020). The second clock signal (output clock signal 1030) is applied to a control block 1040.

The other input to the control block 1040 is the first ratio input R 1050. The first ratio input 1050 is the ratio between the first sampling rate (input sampling rate FSin) of input clock signal 1020 and the output signal sampling rate of output clock signal 1030.

This ratio input 1050 is a fixed point number.

Output 1055 from the control block 1040 is used to clock out the samples 1065 from the buffer 1035 at a rate equal to the output clock rate 1030. These samples 1065 are then applied to the digital interpolation filter 1045. Output 1060 from the control block 1040 is also applied to the digital interpolation filter 1045. The interpolation filter 1045 filters the samples 1065 with the proper delay shift so as to provide the desired output sample 1025.

The sample rate ratio 1050 may be required to be equal to the ratio of the input clock 1020 and the output clock 1030. In practice this number is represented as a fixed point number but if the number of bits is limited, this sample rate ratio 1050 cannot be presented as a fixed point number without some loss of accuracy. For example, if the input sample rate 1020 is $FS_{in}$=44.1 kHz and the output sample rate 1030 is $FS_{out}$=48 kHz, the first desired sampling rate ratio (R 1050) equals 0.91875. Representing this ratio R accurately as a fixed point number with 32 bits or less is not possible. If using 26 bits, for example, then the calculated value for R=61656268.80. In practice, the value for R would need to be set to the closest whole number, in this case 61656269. This error will cause a phase drift and dependent upon the depth of the buffer 1035, will eventually result in the buffer either overrunning or under-running with a subsequent sample error at the output 1025.

A first fractional rate circuit 1001 generates the "Fractional R" pattern and feeds it to the controller 1010.

FIG. 2B is a block schematic diagram of first fractional rate circuit 1001 according to an embodiment of the invention. The "Fractional R" is used so as to ensure that the ratio input, R 50 in FIG. 2A, is correct. Input I, 1100, is the integer of the calculated fixed point value for R. In the example used above, the calculated value for R=61656268.80. Hence, in this example, input I 1100, is INTEGER (61656268.80)=61656268. Input I 1100 is applied as one input to a summation block 1110. The other input 1110 to the summation block 1105 is the value of 1 (one). Hence the output 1115 of the summation block 1105 has the value I+1. In our example this would be 61656268+1=61656269. Input value 1100, I, and the summation output value, 1115, I+1, are inputs to the multiplexer block 1120. A control input 1145 to the multiplexer 1120 is then used to switch the output 1150 of the multiplexer 1120 between the two inputs 1100 and 1115. By switching the output 1150 of the multiplexer 1120 between I and I+1, inputs 1100 and 1115, with a certain pattern, the average value of the output 1150 can be the exact calculated value for R, the input value for input 1050 in FIG. 2A.

Using the same example as before, if the pattern of the output 1150 is 61656269, 61656269, 61656269, 61656269, 61656268, repeatedly, then the average is 6165626.8 exactly. In this case the weights for the pattern are 1 and 4, for I and I+1, respectively. The required pattern input 1145 for the switching of the multiplexer 1120 is provided by the pattern control block 1125. The inputs 1135 and 1140 set the weights for I and I+1, respectively. Input 1135, sets the weight of the value 1100, I, and input 1140 sets the weight of the value, 1115, I+1. The clock 1130 is applied to the pattern control block 1125 such that the output 1145 is switched synchronously with the output sample rate 1030 in FIG. 2A. It should be noted that, in general, there is a wide variety of patterns that could be used to produce the desired average value of R. For example, if the input sample rate 1020 is $FS_{in}$=48 kHz and the output sample rate, 30, is $FS_{out}$=41.4 kHz, then in this case the weights for the pattern are 73 and 74, for I and I+1, respectively. There are many patterns possible with these values for I and I+1. It is clear to see that choosing a pattern that interleaves the two values, I and I+1, will result in a smaller jitter than if a pattern that has 73, I values followed by 74, I+1 values was used.

The output 1150 in FIG. 2B is used as the input 1050 in FIG. 2A so as to provide the synchronous sample rate converter 1010 in FIG. 2A with an accurate sample rate input in the case that the ratio between the input and out sample rates 1020 and 1030 cannot be accurately represented by a fixed point number due to a restricted number of bits. This conversely allows a synchronous sample rate converter to be used when the number of bits of the associated processor word width is not sufficient to accurately represent the required ratio value, without having to resort to higher precision arithmetic. Thus this "Fractional R" scheme provides a potential saving in integrated circuit area, MIPS and power consumption.

FIG. 3A is a block schematic diagram of an asynchronous sample rate converter (ASRC), 100. The ASRC may include of two basic blocks, the phase tracking block 105 and the interpolator block 125. The interpolator block has three main sub-blocks, an input buffer 135, and control block 130 and the interpolator 140. The inputs to the phase tracking block 105 are the input clock 110 and the output clock 115. The input signal 145 is applied to the input buffer 135 of the interpolator block 125. The output 150 from the interpolator block 125 is the output signal. The output 120 of the phase tracking block 105 is applied to the control block 130 in the interpolator block 125. This output 120 is the clock frequency ratio, Rc. The buffer, control and interpolator sub blocks, 135, 130, and 140 respectively within the interpolator block 125 are interconnected so as to convert the input signal 145, which is clocked at one sampling rate, into the output signal 150 which contains the same information as the input signal 145, but is clocked at a different sampling rate. The particulars of this sampling change is well documented and not of concern to this invention. The average value of the clock frequency ratio, 120, is equal to the ratio of the input clock 110 and the output clock 115.

According to an embodiment of the invention ASRC 100 may be coupled between an application processor 155 and a SlimBus connection 160—having the same environment as illustrated in FIG. 1C. The ASRC 100 is in turn connected to a codec 170 via an I2C bus 165. In this example, the application processor 155 generates a 44.1 ksps audio stream. The audio stream is transmitted to the ASRC via a SlimBus connection 160 which operates using a 24,576 kHz clock. The SlimBus scheme allocates certain slots of its bus bandwidth in order to transfer the 44.1 ksps stream, but the clock is at 24,576 kHz. Hence, in this case, the input clock 110 to the phase tracking block 105 of the ASRC 100 is at 24,576 kHz, but the input signal 145 to the buffer 135 of the interpolator block 125 is at 44.1 kHz. The output signal 150 from the interpolator 140 of the interpolator block 125 is required to be at 48 kHz. In this example, the output clock 115 will be at 48 ksps. The required average value for the clock frequency ratio, Rc, 120, is equal to the ratio of the input clock 110 and the output clock 115 and in this example this equates to a value of Rc=2457600048000. The relationship between the available 24576 kHz clock on Slimbus 160 and the desired 44.1 kHz clock from the application processor 155 is:

$$f_{clock\_in} = 2^{Nin} \cdot S_{1,in} / S_{2,in} \cdot 44100 = 24576000$$
$$= 2^9 \cdot 160 / 147 \cdot 44100 = 24576000$$

In general the value for Rc can be represented as a product of $2^N \cdot S_1/S_2$ where N, $S_1$ and $S_2$ are all integers. In this example the following values for N, $S_1$ and $S_2$ apply: N=9, S1=160, S2=147. Hence, Rc=$2^9 \times 160147$. In order to scale Rc a direct solution would be to multiply the value of Rc by $2^{-N} \cdot S_2/S_1$. Whereas scaling by $2^{-N}$ is straightforward, a simple shift operation, scaling by $S_2/S_1$ involves an integer ratio. It is desirable that the ratio is represented as a fixed point number; however, if the number of bits used to represent the ratio is limited, this ratio cannot be presented as a fixed point number without some loss of accuracy.

For example, in the example shown in FIG. 3B, the required scaling is Sf=147/160=0.91875. This scaling ratio Sf is equal to the ratio of the two rates R=44.148=0.91875. Representing this scaling Sf accurately as a fixed point number with a finite number of bits is not always possible. If using 26 bits, for example, then the calculated value for $2^{26} \cdot Sf$=61656268.80. The fractional part 0.8 requires an infinite number of bits and represented as 0.11001100110011 . . . recurring. In practice, the value for $2^{26}Sf$ would need to be set to the closest whole number, in this case 61656269. This error will cause a phase drift and dependent upon the depth of the buffer 135, will eventually result in the buffer either overrunning or under-running with a subsequent sample error at the output 150.

In FIG. 3A the scaling Sf is generated by a first fractional rate circuit 1001. The fractional SF is multiplied by Rc (if such a multiplication is required) and the product R is fed to control 130. FIG. 3B is a block schematic diagram of the first fractional rate circuit 1001 according to an embodiment of the invention. This schematic block diagram is an example basic diagram to demonstrate the practicality of an embodiment of the fractional scaling factor scheme. The fractional scaling factor is used so as to ensure that the scaling, Sf, or rate ratio R is correct. Input I, 200, is the integer of the calculated fixed point value for Sf. In the example used above, the calculated value for $2^b \cdot Sf$=61656268.80. Where b is the number of fractional bits used for Sf representation. Hence, in this example, input I, 200, is INTEGER (61656268.80)=61656268. Input I, 200 is applied as one input to a summation block 205. The other input 210 to the summation block 205 is the value of 1 (one). Hence the output 215 of the summation block 205, has the value I+1. In our example this would be 61656268+1=61656269. Input value 200, I, and the summation output value, 215, I+1, are inputs to the multiplexer block 220. A control input 245 to the multiplexer 220 is then used to switch the output 250 of the multiplexer 220 between the two inputs 200 and 215. By switching the output 250 of the multiplexer 220 between I and I+1, inputs 200 and 215, with a certain pattern, the average value of the output 250 can be the exact calculated value for Sf. Using the same example as before, if the pattern of the output 250 is 61656269, 61656269, 61656269, 61656269, 61656268, repeatedly, then the average is 6165626.8 exactly. In this case the weights for the pattern are 1 and 4, for I and I+1, respectively. The required pattern input 245 for the switching of the multiplexer 220 is provided by the pattern control block 225. The inputs 235 and 240 set the weights for I and I+1, respectively. Input 235, sets the weight of the value 200, I, and input 240 sets the weight of the value, 215, I+1. The clock 230 is applied to the pattern control block 225 such that the average value of the output 245 equals the desired scaling factor Sf. It should be noted that, in general, there is a wide variety of patterns that could be used to produce the desired average value of Sf. For example, if Sf=160147 then in this case the weights for the pattern are 73 and 74, for I and I+1, respectively. There are many patterns possible with these values for I and I+1. It is clear to see that choosing a pattern that interleaves the two values, I and I+1, will result in a smaller jitter than if a pattern that has 73, I values followed by 74, I+1 values was used.

It is often the case that the scaling factor cannot be accurately represented by a fixed point number due to a restricted number of bits. This invention allows an asynchronous sample rate converter to be used when the number of bits of the associated processor word width or HW implementation word width is not sufficient to accurately represent the required scaling factor, without having to resort to higher precision arithmetic. Thus this "fractional scaling factor" scheme provides a potential saving in integrated circuit area, MIPS and power consumption.

FIG. 4A is a block schematic diagram of a duplex ASRC 300, where a single phase tracking block 305 is used together with two interpolators 325 and 360. First interpolator 325 receives a first signal (input signal FS A) 345 and converts it to a second signal (output signal FS B) 350. Second interpolator 360 receives a third signal (input signal FS B) 370 and converts it to a fourth signals (output signal FS A) 365. Hence, together the two interpolators 325 and 360 form a duplex pair. The phase tracking block 305 has two inputs—first clock signal (clock_A) 310 and second clock signal (clock_B) 315. The output of the phase tracking block 305 is the clock frequency ratio Rc 320. Rc 320 is inputted directly to first interpolator 325 and an approximation 355 of its reciprocal (1/Rc) is outputted by closed loop converter 400, to the second interpolator 360. The closed loop converter 400 converts Rc 320 into its reciprocal value, 1/Rc, 355 which is applied to the input of second interpolator 360.

The conversion from FS A 345 to FS B 350 in first interpolator 325 uses Rc, 320 as the clock frequency ratio. When converting in the opposite direction (from FS B 370 to FS A 365) the function performed by second interpolator 360, the sample clock frequency ratio needs to be the reciprocal of Rc 320. Hence the function of the closed loop converter 400 is to convert the signal at its input Rc 320 into a signal 1/Rc 355 at its output.

FIG. 4B is a block schematic diagram of an embodiment of the closed loop converter 400. The input R(m) 405 and the output G(m−1), 460 are a series of discrete positive fixed point numbers and the processing is by two fixed point adders, 420 and 445, one fixed point multiplier 410 and a shifter 435. The closed loop converter 400 uses an iterative process based upon a discrete index, m, and not a continuous time process. The input to the closed loop converter R(m), 405 is applied to one input of a fixed point multiplier 410. The other input to the fixed point multiplier 410 is the output 460 from latch 455 which is the output of the previous iteration, G(m−1). The output 415 of the multiplier 410 is applied to the input of the fixed point adder 420. The other input 425 to the adder 420 is a fixed point unity. The output 430 from adder 420 is the difference between the two inputs to the adder, 425 and 415. This difference value 430 represents an error value which then adjusted in value by the shifter 435. Shifter 435 applies a shift right operation to the error 430, to produce at the output 440 an error value that is a shifted value of the input error 430. This shifted error 440 is applied as an input to the second fixed point adder 445. The other input 460 to the adder 445 is the output 460 of the previous iteration, G(m−1). The output G(m), 450 of the adder 445 is applied to the input of latch 455. At the next iteration, m+1, the output of the latch 460 becomes G(m) and is the new value applied to the input of the multiplier 410 as well as being the new output of the closed loop.

In order to understand the process of the closed loop converter 400 a simple analysis of the steady state condition follows. Assume that the input 405 is at the fixed value R and hence the desired output 460 G(m−1) will have a value of 1/R with a small error, δ(m−1).

Hence, output 460

$G(m-1)=1/R+\delta(m-1)$ where δ(m−1) is a small error.
The output 415 of the multiplier 410 is $R(m) \cdot G(m-1) = R \cdot (1/R + \delta(m-1)) = 1 + R \cdot \delta(m-1)$ This value is then subtracted from unity 425 in the first adder 420 to produce the error value e(m), 430.

$e(m) = 1 - R(m) \cdot G(m-1) = 1 - (1 + R \cdot \delta(m-1)) = -R \cdot \delta(m-1)$ The shifter, 435 shifts e(m) bits 430 to effectively reduce the value of e(m). The shifter 435 effectively multiplies the error value e(m) 430 by a value k, where k=2$^{-N}$ where N is the number of right shifts performed on the error 430. The resulting value, k·e(m) 440 is applied to one input of the second adder 445. The other input 460 to this adder 445 is G(m−1). Hence, the output of the second adder 445 is $G(m) = k \cdot e(m) + G(m-1)$ Substituting for e(m), and setting $G(m-1) = 1/R + \delta(M-1)$ $$G(m) = -k \cdot R \cdot \delta(m-1) + 1/R + \delta(m-1)$$
$$= 1/R + \delta(m-1)(1 - k \cdot R) = 1/R + \delta(m)$$

Hence, after one iteration the value at the output 460 is $G(m)=1/R+\delta(m-1)(1-k \cdot R)$.

To ensure the error is in G(m) is less than that in $G(m-1): |\delta(m)| < |\delta(m-1)|$ $|\delta(m-1)| \cdot |(1-k \cdot R)| < |\delta(m-1)|$ $|(1-k \cdot R)| < 1 \rightarrow (1-k \cdot R) < 1$ and $(1-k \cdot R) > -1 \rightarrow k \cdot R > 0$ and $k \cdot R < 2$.

k·R is always positive since k and R are both positive. Therefore by taking a sufficiently small k the error is further reduced and the output G(m) will approach and be almost exactly equal to 1/R, the desired output value. This closed loop 400 can be perceived as a special case of the normalized LMS (least mean square) algorithm which finds the inverse of linear system form the special case of a single tap-gain transfer function. LMS convergence properties are well known and convergence is guaranteed for a sufficiently small value for k. It is also guaranteed that error function is convex and hence has a single minimum point. The initialization of the value for G(m), 460, could either be an estimate of the correct value, or a simple value such as one or zero. The output G(m), 460, would use the same number of bits as the input R(m), 405 The value of k is a power of 2 so as to simplify the implementation of multiplying the error 430 and hence enabling a shifter 435 to be used. In the general case the input 405 R(m) may vary slightly as the clock frequencies may slowly drift over time, the output 460 G(m) will track these slow drifts and changes.

Using this closed loop conversion scheme in place of carrying out a standard long division or, indeed, using two phase tracking blocks in a duplex ASRC, has several benefits. The closed loop converter can be included as part of the interpolator block and this allows a bank of interpolators and phase trackers to be realized that can be dynamically connected to produce a wide variety of configurations of duplex and simplex sample rate converters. By this means the number of phase tracking blocks can be reduced with the subsequent savings in chip area and cost. Together with the fractional scaling factor scheme described in FIG. 3A, FIG. 3B and FIG. 3C, that realizes accurate scaling value of the clock frequency ratio Rc, the closed loop conversion scheme is an efficient method to produce the reciprocal values also without error. Each scheme, fractional scaling factor, as shown in FIG. 3C, or closed loop converter, as shown in FIG. 4A and FIG. 4A, can be used either together or independent of each other.

While the above descriptions contain many specificities, these should not be construed as limitations on the scope, but rather as an exemplification of one or more embodiments thereof. Many other variations are possible. For example, the method to produce the pattern for the I and (I+1) as described in FIG. 3C can be realized in many ways and the details of the various blocks of the closed loop converter FIG. 4B can vary considerably. Accordingly the scope should not be determined not by the embodiments as illustrated, but by the appended claims and their legal equivalents.

Figure 5:
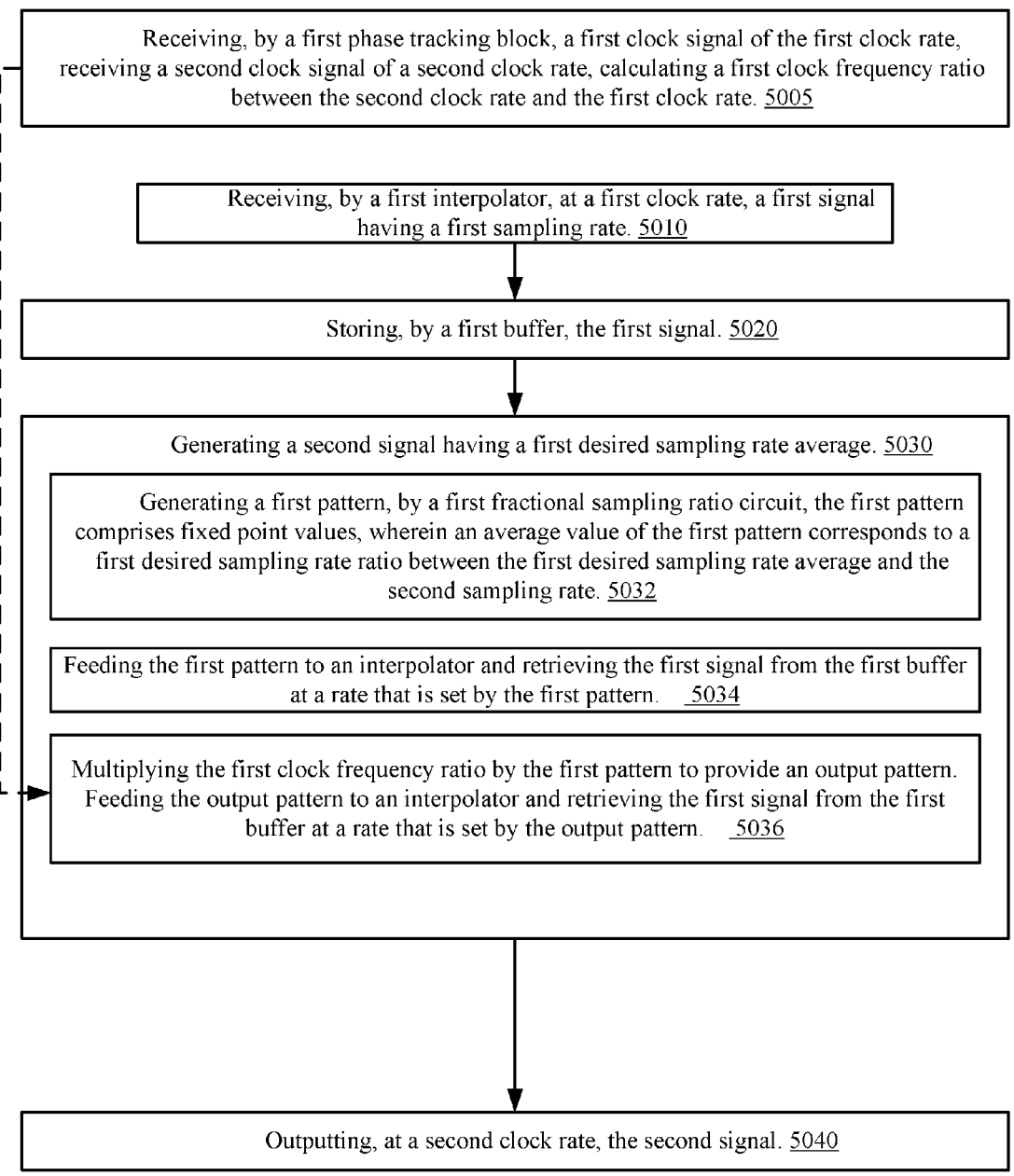
FIG. 5 illustrates a method according to an embodiment of the invention.

FIG. 5 illustrates method 5000 according to an embodiment of the invention.

Method 5000 may start by stage 5010 of receiving, by a first interpolator, at a first clock rate, a first signal having a first sampling rate.

Stage 5010 may be followed by stage 5020 of storing, by a first buffer, the first signal.

Stage 5020 may be followed by stage 5030 of generating a second signal having a first desired sampling rate average. The generating of the second signal may include generating (5032) a first pattern, by a first fractional sampling ratio circuit, the first pattern comprises fixed point values, wherein an average value of the first pattern corresponds to a first desired sampling rate ratio between the first desired sampling rate average and the first sampling rate. The first pattern may be fed to an interpolation filter that assists in generating the second signal. In case of a synchronous sampling rate converter stage 5030 may include stage 5034 of feeding the first pattern to an interpolator and retrieving the first signal from the first buffer at a rate that is set by the first pattern. In a case of an asynchronous sampling rate converter stage 5030 may include stage 5036 of multiplying the first clock frequency ratio by the first pattern to provide an output pattern and feeding the output pattern to an interpolator and retrieving the first signal from the first buffer at a rate that is set by the output pattern.

Stage 5030 may be followed by stage 5040 of outputting, at a second clock rate, the second signal.

Method 5000 may be executed by any interpolated illustrated in the previous figures.

According to various embodiment of the invention the first pattern may include only two fixed point values that differ from each other or may include at least three different fixed point values.

At least two fixed point values of the first pattern may differ from each other by one or by an offset that differs from one.

The first pattern (number of different fixed point values, offset) may be set according to a desired signal to noise ration or any other parameter related to the second signal.

Stage 5032 may include (i) adding by a first adder, an offset to a first fixed point value that is an integer value of the first desired sampling rate ratio, to provide a second fixed point value; (ii) repetitively selecting, by a first multiplexer, between the first fixed point value and the second fixed point value to provide the first pattern.

Method 5000 may also include stage 5005 of receiving, by a first phase tracking block, a first clock signal of the first clock rate, receiving a second clock signal of a second clock rate, calculating a first clock frequency ratio between the second clock rate and the first clock rate. The desired sampling rate ratio may equal the clock frequency ratio or may differ from the clock frequency ratio. The first sampling rate ratio may differ from the first clock frequency ratio by a factor that is responsive to a relationship between the first clock rate and the first sampling rate.

Figure 6:
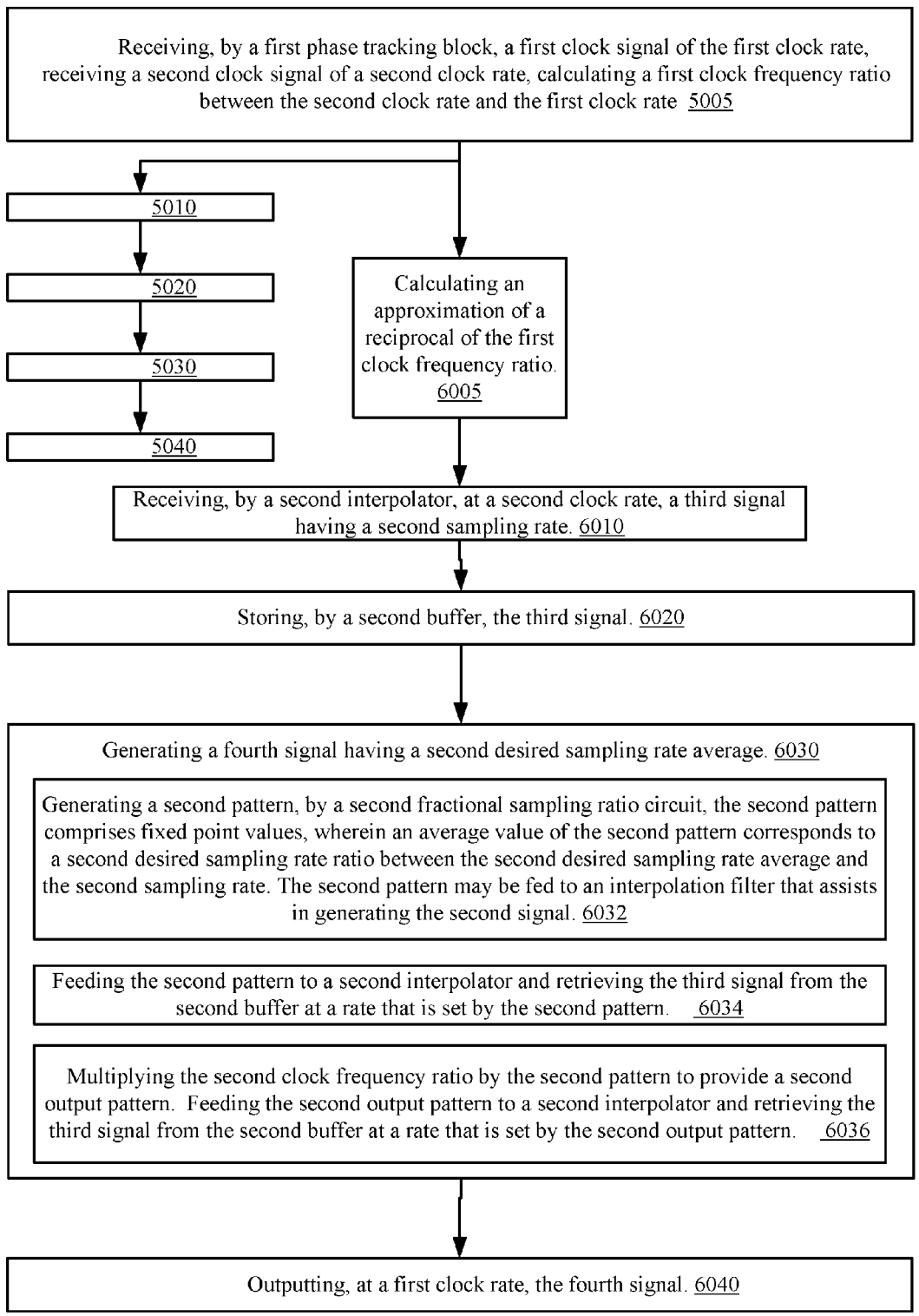
FIG. 6 illustrates a method according to an embodiment of the invention.

FIG. 6 illustrates method 6000 according to an embodiment of the invention.

Method 6000 includes stages 5005, 5010, 5020, 5030 and 5040.

Method 6000 also includes stages 6005, 6010, 6020, 6030 and 6040.

Stage 6005 includes calculating an approximation of a reciprocal of the first clock frequency ratio. The first clock frequency ratio is provided from stage 5005.

Stage 6010 includes receiving, by a second interpolator, at a second clock rate, a third signal having a second sampling rate.

Stage 6010 may be followed by stage 6020 of storing, by a second buffer, the third signal.

Stage 6020 may be followed by stage 6030 of generating a fourth signal having a second desired sampling rate average. The generating of the fourth signal may include generating (6032) a second pattern, by a second fractional sampling ratio circuit, the second pattern comprises fixed point values, wherein an average value of the second pattern corresponds to a second desired sampling rate ratio between the second desired sampling rate average and the second sampling rate. The second pattern may be fed to an interpolation filter that assists in generating the second signal. In case of a synchronous sampling rate converter stage 6030 may include stage 6034 of feeding the second pattern to a second interpolator and retrieving the third signal from the second buffer at a rate that is set by the second pattern. In a case of an asynchronous sampling rate converter stage 6030 may include stage 6036 of multiplying the second clock frequency ratio by the second pattern to provide a second output pattern. Feeding the second output pattern to a second interpolator and retrieving the third signal from the second buffer at a rate that is set by the second output pattern.

Stage 6030 may be followed by stage 6040 of outputting, at a first clock rate, the fourth signal.

REFERENCE NUMERALS IN THE DRAWINGS

| | | | |
|---|---|---|---|
| 100 | Asynchronous sample rate converter (ASRC) | | |
| 105 | Phase tracking block | 110 | Input clock |
| 115 | Output clock | 120 | Clock Frequency Ratio |
| 125 | Interpolator Block | 130 | Control Block |
| 135 | Input Buffer | 140 | Interpolator |
| 145 | Input Signal | 150 | Output Signal |
| 155 | Application Processor | 160 | Input signal to ASRC |
| 165 | Output signal from ASRC | 170 | Codec |
| 200 | Fixed point ratio (integer) | 205 | Summation block |
| 210 | Unity input | 215 | Summation output |
| 220 | Multiplexer | 225 | Pattern Control block |
| 230 | Clock for pattern control | 235, 240 | Pattern inputs |
| 245 | Pattern control output | 250 | Sample Rate, R |
| 300 | Duplex asynchronous sample rate converter | | |
| 305 | Phase tracking block | 310 | Input clock A |
| 315 | Input clock B | 320 | Clock Frequency ratio, Rc |
| 325 | Interpolator, Buffer, Control block | | |
| 345 | Input signal A | 350 | Output signal B |
| 355 | Clock Frequency ratio, 1/Rc | 360 | Interpolator, Buffer, Control block |
| 365 | Output signal A | 370 | Input signal B |
| 400 | Closed loop converter | 405 | Input R(m) |
| 410 | Fixed point multiplier | 415 | Output of fixed point multiplier |
| 420 | Fixed point adder | 425 | Unity input to fixed point adder 420 |
| 430 | Output of fixed point adder 420 | 435 | Shifter |
| 440 | Output of Shifter | 445 | Fixed point adder |
| 450 | Output of fixed point adder 445 | 455 | Latch |
| 460 | Output of latch | | |
| 1001 | Buffer | | |
| 1002 | Synchronous sample rate converter | | |
| 1003 | Servo loop | | |
| 1010 | Synchronous sample rate converter | | |
| 1015 | Input signal | 1020 | Input clock |

| | | | |
|---|---|---|---|
| 1025 | Output signal | 1030 | Output clock |
| 1035 | Input Buffer | 1040 | Control Block |
| 1045 | Interpolation Filter | 1050 | Ratio input, R |
| 1055 | Control output to Buffer | 1060 | Control output to Filter |
| 1065 | Sampled output from buffer | | |
| 1100 | Fixed point ratio (integer) | 1105 | Summation block |
| 1110 | Unity input | 1115 | Summation output |
| 1120 | Multiplexer | 1125 | Pattern Control block |
| 1130 | Clock for pattern control | 1135, 1140 | Pattern inputs |
| 1145 | Pattern control output | 1150 | Sample Rate, R |

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A device, comprising a first interpolator that is configured to (a) receive, at a first clock rate, a first signal having a first sampling rate and (b) output, at a second clock rate, a second signal having a first desired sampling rate average;
   wherein the first interpolator comprises:
   a first buffer for storing the first signal; and
   a first fractional sampling ratio circuit that is configured to generate a first pattern of fixed point values, wherein an average value of the first pattern corresponds to a first desired sampling rate ratio between the first desired sampling rate average and the first sampling rate.

2. The device according to claim 1 wherein the first pattern comprises only two fixed point values.

3. The device according to claim 1 wherein the first pattern comprises at least three fixed point values.

4. The device according to claim 1 wherein the first pattern comprises fixed point values that differ from each other by one.

5. The device according to claim 1 wherein the first pattern comprises fixed point values that differ from each other by an offset that is determine in response to rate conversion system considerations such as a desired signal to noise ratio of the second signal.

6. The device according to claim 1 wherein the first fractional sampling ratio circuit comprises:
   a first adder for adding (a) an offset to (b) a first fixed point value that is an integer value of the first desired sampling rate ratio, to provide a second fixed point value;
   a first multiplexer that has (a) a first input for receiving the first fixed point value, (b) a second input for receiving the second fixed point value; (c) a control input for selecting, in response to a control signal, between the first and second fixed point values to provide the first pattern; and
   a pattern control circuit that is configured to provide the control signal.

7. The device according to claim 1 wherein the rate converter is a synchronous rate converter.

8. The device according to claim 1 wherein the rate converter is an asynchronous rate converter.

9. The device according to claim 1 comprising a first phase tracking block that is arranged to (a) receive a first clock signal of the first clock rate, (b) receive a second clock signal of a second clock rate, (c) calculate a first average clock frequency ratio between the second clock rate and the first clock rate;
   wherein the interpolator is configured to set the first desired sampling rate ratio in response to the average clock frequency ratio.

10. The device according to claim 9 wherein the desired sampling rate ratio equals the average clock frequency ratio.

11. The device according to claim 9 wherein the desired sampling rate ratio differs from the average clock frequency ratio.

12. The device according to claim 9 wherein there the first clock rate differs from the first sampling rate; and wherein the first sampling rate ratio differs from the first clock frequency ratio by a factor that is responsive to a relationship between the first clock rate and the first sampling rate.

13. The device according to claim 1 further comprising:
a second interpolator that is configured to (a) receive, at the second clock rate, a third signal having the second sampling rate and (b) output, at the first clock rate, an fourth clock signal having a second desired output sampling rate average; wherein the second interpolator comprises: a second buffer for storing the third signal; and a second fractional sampling ratio circuit that is configured to generate a second pattern of fixed point values, wherein an average value of the second pattern corresponds to a second desired sampling rate ratio between the second desired output sampling rate average and the second sampling rate.

14. The device according to claim 13 a first phase tracking block that is arranged to (a) receive a first clock signal of the first clock rate, (b) receive a second clock signal of a second clock rate, (c) calculate a first clock frequency ratio between the second clock rate and the first clock rate.

15. The device according to claim 14 wherein the first interpolator is configured to set the first desired sampling rate ratio in response to the first clock frequency ratio; wherein the second interpolator is configure to set to second desired sampling rate ratio in response to a reciprocal of the first clock frequency ratio.

16. The device according to claim 14 wherein the first interpolator is configured to set the first desired sampling rate ratio in response to the first clock frequency ratio; wherein the second interpolator is configure to set to second desired sampling rate ratio in response to an approximation of a reciprocal of the first clock frequency ratio.

17. The device according to claim 16 comprising a reciprocal calculator that is configured to (a) receive the first clock frequency ratio and (b) calculate the approximation of the reciprocal of the first clock frequency ratio.

18. The device according to claim 14 wherein the first phase tracking block is an only phase tracking block that feeds the first and second interpolators.

19. A method, comprising:
receiving, by a first interpolator, at a first clock rate, a first signal having a first sampling rate;
storing, by a first buffer, the first signal;
generating a second signal having a first desired sampling rate average; wherein the generating of the second signal comprises generating a first pattern, by a first fractional sampling ratio circuit, the first pattern comprises fixed point values, wherein an average value of the first pattern corresponds to a first desired sampling rate ratio between the first desired sampling rate average and the first sampling rate; and
outputting, at a second clock rate, the second signal.

* * * * *